United States Patent
Freytag (10) Patent No.: US 9,035,655 B2
(45) Date of Patent: May 19, 2015

(54) DOUBLY TUNED RF RESONATOR

(75) Inventor: Nicolas Freytag, Binz (CH)

(73) Assignee: Bruker BioSpin AG, Faellanden (CH)

( * ) Notice: Subject to any disclaimer, the term of this patent is extended or adjusted under 35 U.S.C. 154(b) by 548 days.

(21) Appl. No.: 13/409,132

(22) Filed: Mar. 1, 2012

(65) Prior Publication Data
US 2012/0242338 A1     Sep. 27, 2012

(30) Foreign Application Priority Data
Mar. 25, 2011   (DE) .......................... 10 2011 006 157

(51) Int. Cl.
G01R 33/34   (2006.01)
G01R 33/36   (2006.01)

(52) U.S. Cl.
CPC ...... G01R 33/34076 (2013.01); G01R 33/3635 (2013.01)

(58) Field of Classification Search
CPC ............... G01R 33/341; G01R 33/422; G01R 33/3635; G01R 33/34046; G01R 33/34076
See application file for complete search history.

(56) References Cited

U.S. PATENT DOCUMENTS

| | | | |
|---|---|---|---|
| 4,680,548 A | | 7/1987 | Edelstein |
| 4,916,418 A | | 4/1990 | Rath |
| 5,144,240 A | * | 9/1992 | Mehdizadeh et al. ........ 324/318 |
| 5,194,811 A | | 3/1993 | Murphy-Boesch |
| 5,202,635 A | | 4/1993 | Srinivasan |
| 6,029,082 A | * | 2/2000 | Srinivasan et al. ............ 600/422 |
| 6,100,694 A | * | 8/2000 | Wong ............................. 324/318 |
| 6,150,816 A | * | 11/2000 | Srinivasan ..................... 324/318 |
| 6,788,056 B2 | * | 9/2004 | Vaughan et al. ............... 324/318 |
| 6,850,064 B1 | * | 2/2005 | Srinivasan ..................... 324/318 |
| 6,958,607 B2 | * | 10/2005 | Vaughan et al. ............... 324/318 |
| 7,119,541 B2 | * | 10/2006 | Barberi .......................... 324/318 |
| 7,123,012 B2 | * | 10/2006 | Srinivasan ..................... 324/318 |
| 7,292,038 B2 | * | 11/2007 | Doty .............................. 324/318 |
| 7,800,368 B2 | * | 9/2010 | Vaughan et al. ............... 324/318 |
| 8,035,384 B2 | * | 10/2011 | Saha .............................. 324/318 |
| 8,125,225 B2 | * | 2/2012 | Koretsky et al. .............. 324/318 |
| 8,203,342 B2 | * | 6/2012 | Ochi et al. ..................... 324/318 |
| 2009/0256569 A1 | | 10/2009 | Hancu |

FOREIGN PATENT DOCUMENTS

DE       101 09 489       10/2001

* cited by examiner

Primary Examiner — Dixomara Vargas
(74) Attorney, Agent, or Firm — Paul Vincent (57) ABSTRACT

An RF resonator has a birdcage resonator with two electrically conducting ring elements (12, 33, 47) and N electrically conducting bars (11). At least one pair of electrically conducting ring segments (32a, 32b, 40, 43) forms an additional electrical connection between precisely two bars (11). The pair of ring segments (32a, 32b, 40, 43) define a current path (41, 42) with these two bars (11) which is capacitively interrupted at at least one point. The ring segments (32a, 32b, 40, 43) and the bars (11) electrically connected to the ring segments (32a, 32b, 40, 43) are disposed symmetrically with respect to the yz-plane. The field homogeneity and efficiency are thereby optimized even with frequencies that are far apart.

8 Claims, 10 Drawing Sheets

DOUBLY TUNED RF RESONATOR

This application claims Paris Convention priority of DE 10 2011 006 157.6 filed Mar. 25, 2011 the complete disclosure of which is hereby incorporated by reference.

BACKGROUND OF THE INVENTION

The invention relates to an RF resonator for an NMR apparatus, wherein the RF resonator comprises a birdcage resonator for transmitting and/or receiving signals with a first measurement frequency, wherein the RF resonator is symmetrical with respect to an xz-plane and a yz-plane of a Cartesian coordinate system with a Z-axis, with at least two electrically conducting ring elements that are disposed coaxially about the Z-axis and spaced from each other, N electrically conducting bars that are disposed parallel with the Z-axis, where N>4 and is even, wherein each ring element is electrically connected with all N bars.

Such an RF resonator is known from reference [1].

A birdcage resonator comprises N bars and at least 2 ring elements. A bar is understood to be electrically conducting elements elongated in the z-direction that usually lie approximately on a cylinder envelope parallel with the z-axis and that have an upper and a lower end.

Ring elements are understood to be electrically conducting ring or tube-shaped, usually circular or elliptical at least in sections, that are electrically (galvanically or capacitively) connected with N bars at the upper or lower end.

Moreover, a birdcage resonator has capacitors that can interrupt the bars, the ring elements, or both. At least one capacitive interruption must exist, either on at least one of the ring elements between each connecting point of a bar with ring elements or on each bar between the two connecting points of the bars with the ring elements. For capacitive interruption of the bars of a birdcage resonator, therefore N capacitors, for capacitive interruption of a ring element, at least N−2 capacitors are required.

A birdcage resonator has two orthogonal linearly polarized modes that generate a dipolar field that can be conveniently used for NMR. In a low-pass birdcage resonator, these are the two lowest modes.

Figure 1A:
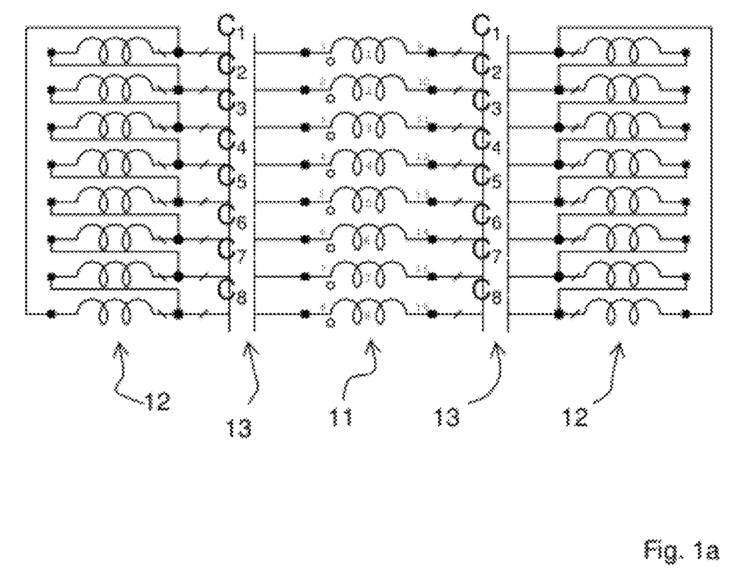
FIG. 1a shows an electrical circuit diagram of a low-pass birdcage resonator with eight bars, two end rings, and capacitors at the transition between bars and ring elements according to the prior art. Inductive couplings between bar and ring inductances are not shown.
Figure 1B:
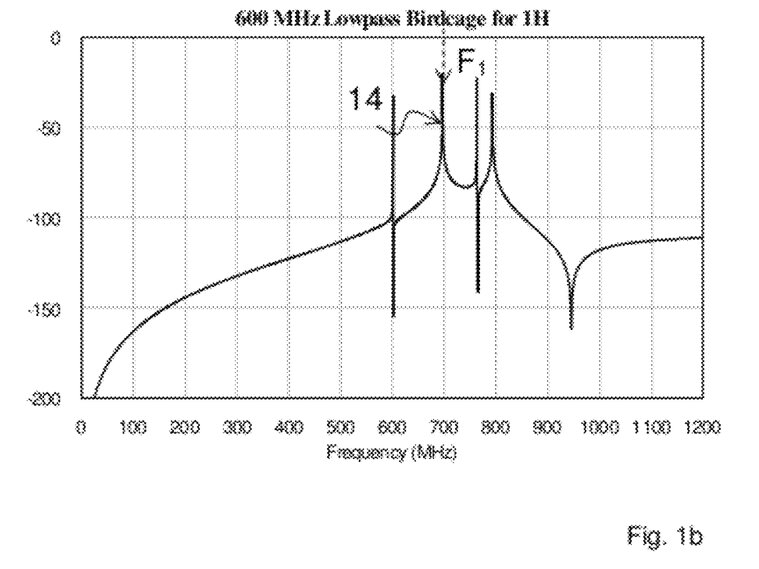
FIG. 1b shows a transmission spectrum of a symmetrical 600 MHz ($^1$H) low-pass birdcage resonator with eight bars according to FIG. 1a with weak coupling and coupling out by means of broadband coupling networks. The resonance at $F_1$ consists of two degenerate dipolar modes. To generate the spectrum, coupling in and out was performed by means of weak inductive coupling so that all modes of the resonator are acquired.

FIG. 1b shows the mode spectrum with two linearly polarized modes 14 of a symmetrical birdcage resonator with eight bars, as is shown in FIG. 1a. If the birdcage resonator is rotationally symmetric, these two linearly polarized modes 14 are degenerate and can be used simultaneously for quadrature operation at one frequency to produce a circularly polarized field. The arrow in FIG. 1b marks the two degenerate linearly polarized modes 14 that oscillate at a frequency $F_1$. The advantage of quadrature detection and excitation are a signal-to-noise ratio that is $\sqrt{2}$ higher than with detection/excitation with linearly polarized modes and is achieved in particular even with measurement samples subject to losses. Furthermore, with quadrature excitation, only half the power is required for the same flip angle and the same pulse length.

For quadrature operation of a resonator, two mutually orthogonal orientations by means of coupling networks are usually preferred and thus form two mutually orthogonal mirror symmetries along the xz- and the yz-plane. To generate and detect the circular polarization, the linearly polarized modes are operated and detected with a phase difference of 90°. The relevant modes are thus mutually orthogonal, i.e. the electrical plane of symmetry of the first degenerate mode corresponds to the magnetic plane of symmetry of the second degenerate mode and vice versa.

FIG. 1a shows a discrete element circuit diagram of such a low-pass birdcage resonator with eight bars 11 that are electrically connected to two ring elements 12. The bars are capacitively interrupted by sixteen capacitors 13 with capacitances C1-C8. The inductive couplings between bars 11, the ring elements 12, and between bars and ring elements are not drawn in FIG. 1a.

Figure 2A:
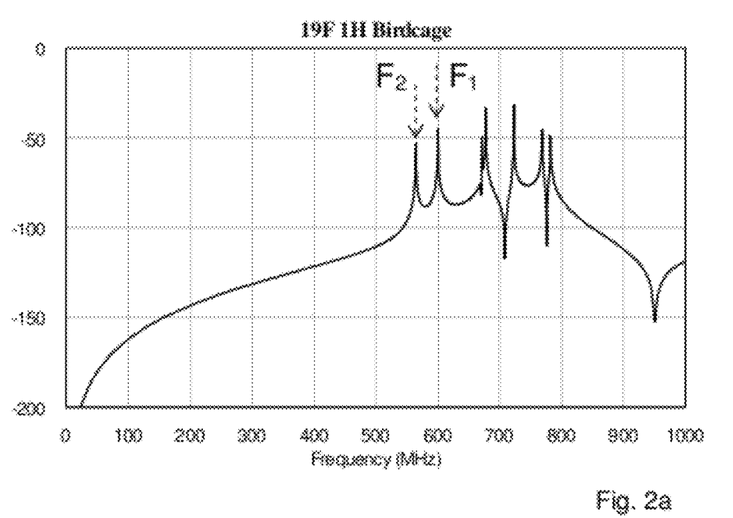
FIG. 2a shows a transmission spectrum of a birdcage resonator doubly tuned for $^{19}$F and $^1$H according to the prior art with eight bars, in which the electrical symmetry has been broken in relation to the resonator from FIG. 1b. The two modes at $F_1$ and $F_2$ are orthogonal dipolar modes.

To tune more than only one frequency that can be used for NMR on a birdcage resonator, it is possible to break the symmetry of the birdcage resonator (e.g. by shifting the geometric positions of the bars, varying the capacitance of the capacitors, or a combination of the two) and thus generating two orthogonal modes of different frequencies $F_1$ and $F_2$, as is disclosed in reference [1], p. 415. This usually changes the capacitances in such a way that, instead of standard values C of all capacitors, e.g. the capacitance values of two capacitors in each case are lowered ($C_1=C_5<C$) while those of two other capacitors are increased ($C_3=C_7>C$). The capacitance values of the remaining four capacitors remain unchanged ($C_2=C_4=C_6=C_8=C$). This cancels the degeneration of the linear modes and shifts one to a higher, the other to a lower frequency. The mode spectrum of such a non-symmetrical birdcage resonator is shown in FIG. 2a. This method is typically used to split the resonance for frequencies that are relatively close to each other. This is the case, for example, of $^1H$ and $^{19}F$. By splitting the symmetry, the degeneration of the other modes is canceled so that the birdcage resonator now has a total of eight modes at different frequencies, wherein only the lowest two generate a dipolar field that can be conveniently used for NMR (linearly polarized). These modes are marked with arrows in FIG. 2a.

In this first variant of a doubly tuned birdcage resonator known according to the prior art, the bars and ring element of the birdcage resonator are identical for both frequencies, i.e. both frequencies oscillate on the same bars and ring elements. In this way, the efficiency of the resonator is only slightly impaired at both measurement frequencies by the presence of the second frequency. The field profiles are almost identical so that both frequencies "see" exactly the same measurement volume. However, the two modes can only be operated linearly, i.e. quadrature operation is no longer possible!

If the frequency difference between the modes is too great, the field homogeneities of both modes become severely impaired in this first variant because the currents are no longer evenly sinusoidally distributed over the bars. Field homogeneity is understood here, in particular, to be the radial distribution of the field whereas field profile is understood to be the axial distribution. The quality and therefore also the efficiency are further reduced because the current only uses some of the bars. The remaining conductors are "in the way" of the field, generate additional losses and partially shield the field in the measurement volume. In the extreme case of very different frequencies, the current flows almost only on two of the eight bars in both resonance modes.

Figure 2B:
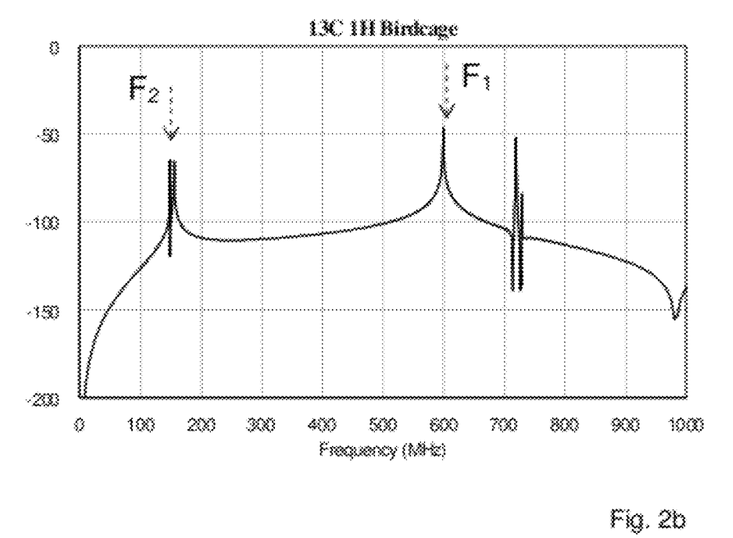
FIG. 2b shows a transmission spectrum of a symmetrical birdcage resonator doubly tuned for $^{13}$C and $^1$H with two sub-grids with four bars each. The two modes at $F_1$ and $F_2$ are each two degenerate dipolar modes.

In this case, it makes sense to build a second variant of a doubly tuned birdcage resonator, in which the birdcage resonator comprises two sub-grids with capacitors with different capacitance values $C_2=C_4=C_6=C_8=C_a$ and $C_1=C_3=C_5=C_7=C_b$, where $C_a \ll C_b$, as is disclosed in reference [1], p. 417. In this birdcage resonator, two degenerate modes arise at each of the frequencies $F_1$ and $F_2$. In a birdcage resonator with a total of eight bars, the field homogeneity of these two modes can only be used in quadrature operation during excitation and reception (as for a resonator with only four bars). The spectrum of such a birdcage resonator is shown in FIG. 2b; each of the two degenerate linearly polarized modes is indicated by an arrow.

The situation of two measurement frequencies that are far apart occurs in nuclear magnetic resonance spectroscopy, in particular, if $F_1$ is the frequency of $^1H$ or $^{19}F$ and $F_2$ of a nucleus of low frequency, in particular, $^{31}P$, $^{13}C$, or $^{15}N$.

For operation with only linear polarization, the homogeneity is also extremely poor in the second known variant and the number of bars must be at least doubled. Further, the lower frequency partially shields the higher frequency so that the efficiency of the resonator is severely reduced as compared with the symmetrical resonator. The shielding effect increases as the number of bars increases while a large number of bars is essential for good field homogeneity.

In this second variant of the double tuned birdcage resonator with two sub-grids, the ring elements are used at both measurement frequencies while the bars are only used at one. This results in losses because the unused bars are "in the way" of the RF field and take almost no net current to resonance.

A subclass of these is formed by birdcage resonators in which the legs oscillating at the high frequency are insulated from the influence of the lower frequency by bandstop filters, thus improving the efficiency at the higher frequency to the detriment of the efficiency at the lower frequency.

A third variant of a doubly tuned birdcage resonator is described using multiple end rings, as described, for example, in reference [4]. There are combinations of low-pass and high-pass versions. However, in all of them, the higher frequency always has to be blocked in the ring element of the lower frequency by means of switches or low-pass filters. These filters or switches produce additional losses or noise so that the efficiency is reduced, in particular, at the higher frequency. Due to the larger number of rings, the field profile is usually no longer identical at the different frequencies. However, this is not particularly critical in practice. Here, the field profile is understood to be the field distribution in the measurement sample as a function of z.

In birdcage resonators with multiple end rings, the two resonance frequencies can each be tuned to two degenerate modes and thereby used in quadrature. The spectrum of such a birdcage resonator very much depends on the specific technical implementation, so it is not described here.

Furthermore, according to the third variant, a birdcage resonator is extremely complex to manufacture because the bandstop filters must be tuned identically, must not generate an NMR-active field (i.e. no field components that are perpendicular to the static magnetic field $B_0$ in the measurement volume), must not produce interference with the homogeneity of the static magnetic field $B_0$ due to their magnetic susceptibility, and the symmetry must not be broken during tuning (i.e. during adjustment of the resonance frequency of the resonator to the Larmor frequency of the nucleus to be measured in the given static magnetic field $B_0$) and when the resonator is coupled. Because of the numerous technical difficulties, this concept has not become generally accepted in NMR.

Because of the numerous different ways of implementing such birdcage resonators with integrated filters, reference is made to references [1], [3], [4] and these are not described or explained in further detail here.

The object of the invention is to propose an RF resonator for a magnetic resonance measuring head that is optimized for transmitting and receiving at two measurement frequencies, wherein one of the frequencies is clearly higher than the second frequency, in particular, with a frequency difference of more than 7%. The field homogeneity and efficiency should be maximum for both frequencies and the field profiles, in particular, the length in the z-direction and the rate of change (decrease in the z-direction at the edge of the field profile) should be identical, if possible.

SUMMARY OF THE INVENTION

This object is inventively achieved by an RF resonator according the independent claim.

According to the invention, at least one pair of electrically conducting ring segments is provided for transmitting and receiving signals with a second measurement frequency in addition to the elements of the birdcage resonator. The ring segments of a pair are spaced from each other with respect to the Z-axis and form an additional electrical connection between precisely two of the N bars. The pair of electrically conducting ring segments forms a current path with these two bars, wherein the current path is capacitively interrupted at at least one point. The ring segments and the bars that are electrically connected to the ring segments are disposed symmetrically with respect to the yz-plane.

With the inventive resonator, only one non-degenerate linearly polarized mode is produced for each NMR-active resonance frequency. Because the elements of the inventive RF resonator are disposed symmetrically with respect to the xz- and yz-planes, it is possible to generate two independent modes with different frequencies. The symmetry of the inventive RF resonator does not necessarily refer to the capacitance values of the capacitors because certain structurally necessary asymmetries can be corrected by means of asymmetry of the capacitor values, so that the RF fields become orthogonal again. In a preferred embodiment, the capacitors are also symmetrical with respect to the capacitance values. The second mode generated by the inventive RF resonator (with the second frequency $F_2$) is not a birdcage mode because in an inventive RF resonator, unlike the first mode (birdcage mode), the second mode oscillates on current paths that only comprise two bar elements (elements in the axial direction with respect to the z-axis). The mutual inductance between the inductances in these current paths results in a dipolar mode in which all current paths are oscillating in phase. In particular, bars that are not positioned with mirror symmetry with respect to the electrical plane of symmetry (xz-plane) of the resonator in operation at the second frequency only have galvanic or capacitive coupling by means of capacitors via the ring elements, but not via ring segments. (Parasitic capacitances are not taken into account.)

For the purpose of the invention, ring segments are understood to be electrically conducting rings or ring sections that are directly electrically connected only by two bars of the RF resonator. This additional electrical connection can be achieved galvanically or capacitively. The additional connection between the two bars is therefore only formed by the pair of ring segments. The inventive ring segments form pairs and the ring segments of one pair and the two bars connected with these ring segments form a current path for generating the second frequency. If the RF resonator is operated at the second frequency, the greater part of the current will flow on these current paths (comprising the ring segments). Then either at least one of the ring segments of a pair must be capacitively interrupted or at least one of the two bars with the ring segments must have a capacitive interruption so that the current path is capacitively interrupted at least at one point. The ring segments, ring elements, and bars of the inventive RF resonator may therefore either not be capacitively interrupted at all or be capacitively interrupted any number of times, as long as each current path is capacitively interrupted at least at one point. Different current paths are inductively coupled to each other. Short circuits of the ring segments via the ring elements must be avoided, which can be achieved by corresponding capacitive interruptions of the ring elements. By choosing the capacitance values of the capacitive interruptions of the ring segments or the bars, the desired second frequency can be defined. By choosing the ratios of the capacitors on different ring segments, which are not connected to the same bars, that is, are assigned to different current paths, the current distribution over the different bars, that is, the generated field homogeneity, can additionally be set. If the bars have capacitive interruptions, this also applies to the choice of ratios of the capacitance values on the bars.

The following rule of thumb applies to setting the resonance frequency: If the second frequency is to be lower than the first frequency, the capacitance values of the capacitors interrupting the current paths for the second frequency must be larger than the capacitance values of the capacitors on the ring elements or the bars that do not form a current path for the second frequency with the ring segments. On the other hand, if smaller capacitance values are chosen for the capacitors interrupting the current paths than the capacitance values of the capacitors that do not form part of a current path for the second frequency, a second frequency arises that is higher than the first frequency. Because, when considered in detail, the inductances of the current paths also have to be taken into account, deviations from this rule of thumb can occur. The second frequency is usually chosen to be lower than the first frequency because then the influence of the two frequencies on each other is minimal.

It is advantageous if the ring segments are connected to bars whose potential difference during operation at the first frequency is as small as possible. In a birdcage resonator with mirror symmetry, two bars each are at the same or almost the same potential. The influence of the ring segments and of any additional capacitive interruptions at the first frequency is minimal if bars of the same potential are connected by means of a pair of ring segments because then no potential difference prevails during operation at the first frequency in this added additional current path and therefore no change in the current flow occurs during operation at the first frequency. Unlike with the prior art, blockage of the first frequency within the current path of the second frequency can then be dispensed with and the resistive losses associated with the bandstop filter can be avoided. In a preferred embodiment of the invention, the bars of a current path of the second frequency therefore have the same potential during operation at the first frequency.

In the inventive RF resonator, the first frequency oscillates on all N bars of the RF resonator. In this way, maximum efficiency can be achieved with regard to the first frequency. Additional losses due to the presence of the current paths for the second frequency only occur due to field displacement on ring segments that may be in the way of the generated RF field of the first frequency. In this way, the efficiency of the RF resonator during operation at the first frequency remains almost unchanged as compared with an RF resonator without additional current paths for the second frequency.

The bars of the RF resonator are preferably disposed on the lateral surface of a cylinder. The Z-axis of the coordinate system is then equal to the axis of the cylinder. This is an advantage, in particular, if the object to be measured is cylindrical because the current-carrying elements can then be placed as close as possible to the object to be measured and the efficiency of the RF resonator can be as high as possible.

The ring segments of the inventive resonator are disposed symmetrically with respect to the yz-plane. The magnetic RF field therefore only has tangential components in the yz-plane during operation at the second measurement frequency. During operation of the RF resonator with the first measurement frequency, the magnetic RF field only has tangential components in the xz-plane and is therefore orthogonal to the RF field during operation at the second measurement frequency.

A ring element consists either of one ring or of two partial rings that are not capacitively connected to each other. Stray capacitances, that is, capacitances that do not arise due to discrete or distributed capacitors or elements comparable to these, are neglected herein. Stray capacitances are usually at least one order of magnitude smaller than the smallest capacitance with which the bars and ring segments are capacitively interrupted.

Ring elements are preferably conductor elements in the shape of a circular ring, of a regular polygonal ring, of an elliptical ring, or sections thereof and have any cross-section. To minimize the elongation in the Z-direction, a square, circular, or ring-shaped cross-section is advantageous. To limit the dimensions in the radial direction, an axially elongated rectangular or elliptical cross-section is preferred.

Here, too, stray capacitances can be neglected, in particular, because these only have minor effects on the current distribution over the current paths during operation due to the symmetrical structure of the resonator.

Each ring or partial ring of a ring element can be capacitively interrupted. "Capacitive interruption" means that the interrupted element is physically divided into two parts that are capacitively coupled to each other, that is, they form a capacitor. The bars and ring segments can also be capacitively interrupted. An interruption of a bar directly at the transition to the ring element is considered to be an interruption of the bar. The capacitive interruptions can be implemented either with discrete capacitors or distributed capacitive elements such as finger capacitors or plate capacitors in which the plates form part of the bars or rings.

The number of bars, capacitors, and ring segments depends on the desired performance and the desired dimensions and complexity of the structure. Generally the following applies: A larger number of bars improves the homogeneity; a larger number of capacitors reduces the electrical fields and increases the dielectric strength during transmission, in particular, with skilled positioning of the capacitive interruptions. A larger number of ring segments, that is, a larger number of inductively coupled current paths for operation at the second frequency improves the homogeneity of the field and usually also the efficiency in this mode of the second frequency. The smallest possible radial dimensions of the ring elements and ring segments increase the rate of change and therefore improve the field profile. The fewer components are used, the more space-saving and less complex the structure of the resonator can be.

As described above, the ring elements can each comprise one electrically conducting ring. In this case, however, part of the current flows through the ring elements and their capacitive interruptions during operation at the second frequency. In a preferred embodiment of the inventive RF resonator, the ring elements are interrupted and comprise two partial rings that are not capacitively connected to each other, each partial ring being electrically connected to N/2 bars.

The non-capacitive interruptions are preferably located on the magnetic plane of symmetry of the resonance mode of the first frequency, i.e. the xz-plane. Alternatively, the interruptions can also be located at any position between the bars nearest the xz-plane. The non-capacitive interruption of at least one ring element can be used to avoid short circuits of the ring segments over the ring elements.

The symmetrical configuration of the ring segments with respect to the yz-plane which is disposed perpendicular to the plane of symmetry of the ring elements (xz-plane), then causes the mode of the second frequency not to be influenced by the mode of the first frequency. Because the ring elements are divided into partial rings, current can no longer flow through the ring elements over the xz-plane during operation at the second frequency. The partial rings of a ring element together do not have to make up a complete ring, that is, the central angle of the partial rings (angle of the circle/ellipses/polygon segments that is enclosed by the partial ring) is usually <180°.

To set the resonance frequencies of the two modes independently, to minimize residual couplings and the number of installed elements, it is advantageous if at least one of the ring segments has only one capacitive interruption, which is disposed on the yz-plane. Multiple capacitive interruptions can also be provided which are symmetrical with respect to the yz-plane. This increases the number of components, but lowers the voltages and provides a possible connection point on the resonator that is at zero potential during operation at the second frequency.

In a special embodiment of the inventive RF resonator, at least some of the ring segments are disposed at the same axial positions with respect to the Z-axis as the ring elements. The radial distance (distance from the Z-axis) of the ring segments can (but does not have to) be different from the radial distance of the ring elements. If the ring segments and ring elements are at the same axial position, the field profiles of the two resonance modes in the z-direction are especially similar.

Alternatively or in addition thereto, at least one part of the ring segments can be disposed at the same radial distance from the Z-axis as the ring elements. In the case of elliptical ring elements, "same radial distance" means that the ring segment has the same semi-axes as the ring elements. In the case of interrupted ring elements, the ring segments can be placed in the gaps resulting from the interruption so that the ring element and the ring segments placed in the gaps complement each other to form a circle/ellipse, etc. At the same radial position, the radial dimensions of the resonator are as small as possible and installation of a further resonator or of a transmitter/receiver coil concentrically around the inventive resonator is simplified.

The number of ring segments is especially preferably equal to the number N of bars. Each bar is then connected to another bar through exactly two ring elements. In this case, all bars are used for both frequencies. This results in maximum efficiency with respect to the second frequency and it is possible to set the field homogeneity during operation of both resonance modes with a maximum number of degrees of freedom.

In an advantageous embodiment, at least one ring element is capacitively interrupted by a tuning capacitor that is disposed in the yz-plane. The second resonance frequency can be varied using this capacitor. The tuning capacitor can also be routed via leads outside the resonator.

In a further advantageous embodiment, two ring segments, disposed with mirror symmetry with respect to each other, are connected to each other by means of a tuning capacitor in such a way that the connecting points are located at the points of intersection of the ring segments with the yz-plane. The first resonance frequency can be detuned using this tuning capacitor.

In an especially advantageous embodiment, one of the ring segments of the current path of the second resonance frequency is not capacitively interrupted. The current path of the second resonance frequency then has only capacitive interruptions on one of the two associated ring segments. This results in a "DC current path" via which any number of further frequencies can be coupled using known methods for saddle or solenoid coils.

The inventive RF resonator can be used both in NMR spectroscopy and in MR imaging.

Further advantages result from the description and the drawing. Moreover, the features stated above and further below can be used singly or together in any combination. The embodiments shown and described are not intended to be an exhaustive list but are rather examples to explain the invention.

DESCRIPTION OF THE PREFERRED EMBODIMENT

The inventive RF resonator can be constituted as a high-pass, low-pass, and bandpass resonator depending on whether the capacitors capacitively interrupt the ring elements (high pass), bars (low pass), or both (bandpass). All the variations shown with respect to number of bars, additional capacitors, symmetry, constitution of the ring elements and ring segments can be used for high-pass, low-pass, and bandpass resonators.

Figure 3A:
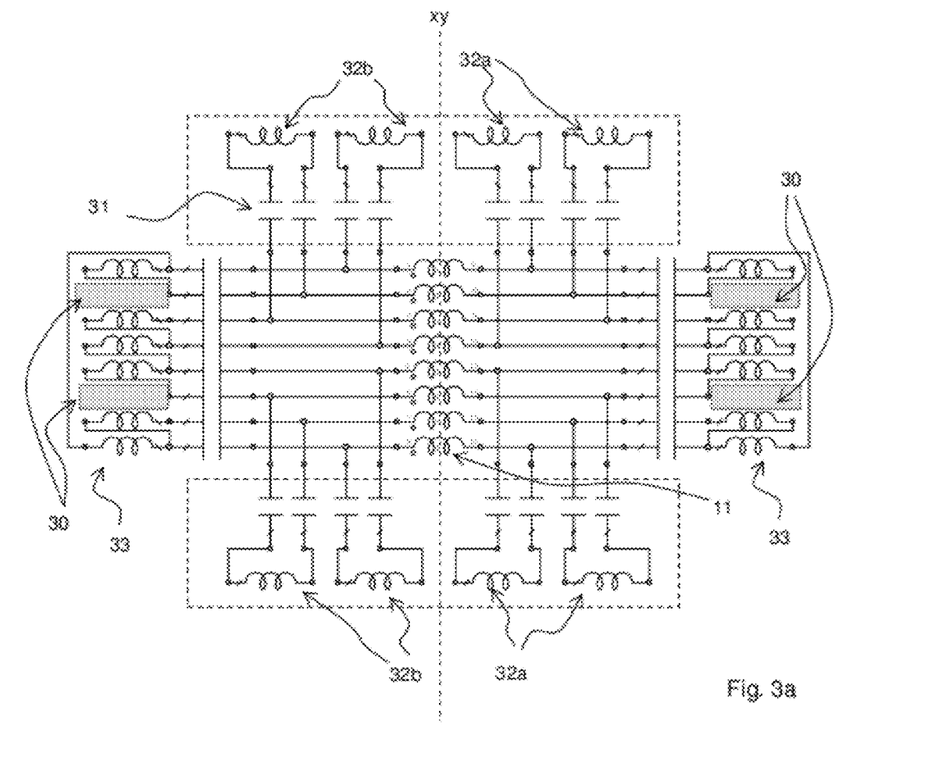
FIG. 3a shows an inventive RF resonator with eight bars, eight additional ring segments, and sixteen additional capacitors. The two end rings have each been broken open by removing two parts of the ring element of each end ring.

FIG. 3a schematically shows how an inventive doubly tuned resonator can be produced by modification of the birdcage resonator of FIG. 1a. By adding additional upper ring segments 32a, lower ring segments 32b, and further capacitors 31, it is possible to cancel degeneration of the mode to be used for the first measurement frequency. Each ring segment pair is constituted by one upper ring segment 32a and one lower ring segment 32b. To obtain a resonator that is as symmetrical as possible on both NMR-active resonance modes, they can be disposed symmetrically with respect to the xy-plane. Each ring segment pair forms a part of a current path of the RF resonator and is electrically conductively connected with exactly two bars 11.

The embodiment of the RF resonator shown in FIG. 3a has ring elements 33 with interruptions 30 in the yz-plane (magnetic plane of symmetry of the first resonance mode $F_1$). Each ring element 33 comprises 2 partial rings that are connected to four of the eight bars 11. The broken open ring elements 33 are not ring segments for the purpose of the invention because they are galvanically connected with more than just two bars 11. (for illustration, in FIG. 3a, the parts of the ring elements 33 removed with reference to FIG. 1a are bordered with a dotted line and hatched). The ring segments 32a, 32b and the additional capacitors 31 must be placed so that they are located symmetrically with respect to the magnetic plane of symmetry of the first frequency $F_1$ (yz-plane). There is no galvanic connection between the ring segments 32a, 32b and ring segments 12.

By adding the additional capacitors 31 and the ring segments 32a, 32b, at least two orthogonal planes of symmetry of the resonator are obtained.

Figure 3B:
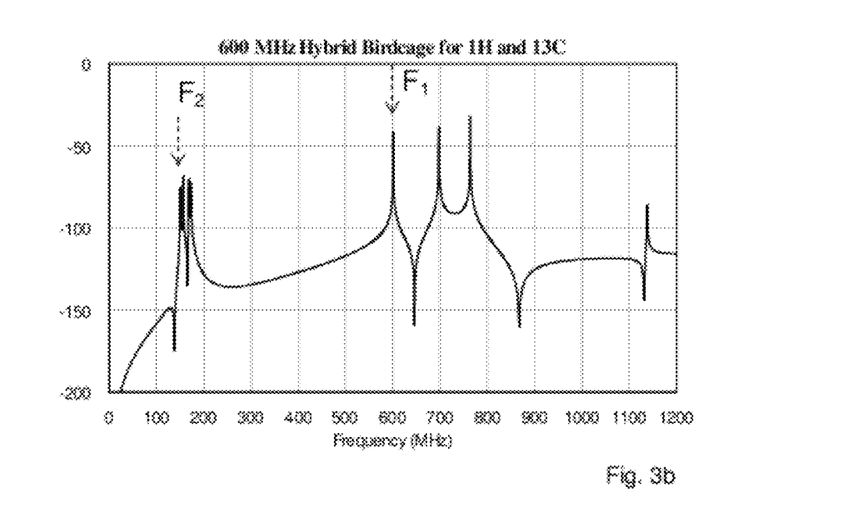
FIG. 3b shows a transmission spectrum of the inventive doubly tuned RF resonator FIG. 3a for $^1$H and $^{13}$C. The modes at $F_1$ and $F_2$ are two orthogonal dipolar modes.
Figure 3C:
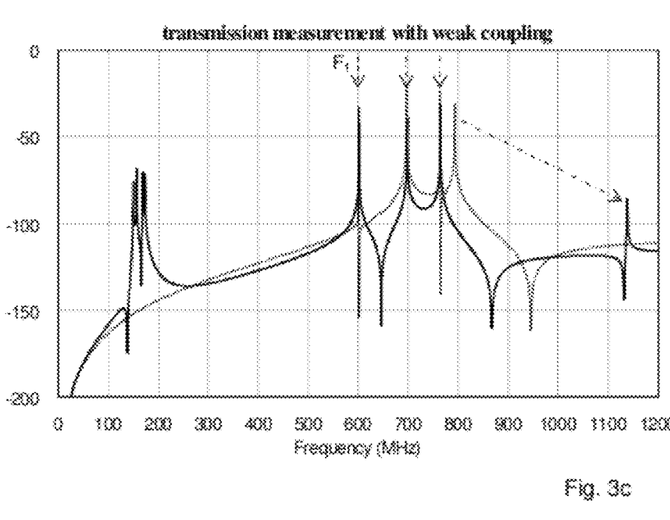
FIG. 3c shows a comparison of the transmission spectrums from FIG. 1b and FIG. 3b. The frequencies of the first three modes of the birdcage resonator remain unaffected. Only the highest mode is shifted to higher frequencies.

FIG. 3b shows a transmission spectrum of the inventive birdcage resonator from FIG. 3a. The modes at $F_1$ and $F_2$ are two orthogonal dipolar modes. Due to the symmetrical placing of the additional elements (ring segments 32a, 32b and the additional capacitors 31 with respect to the magnetic plane of symmetry of the first frequency $F_1$ (linear birdcage mode), the latter is not influenced (see FIG. 3c). Only octupole mode (on the low-pass birdcage with eight bars of the highest mode) is shifted to higher frequencies (see arrow in FIG. 3c).

For the first resonance mode, the additional capacitors 31 and the ring segments 32a, 32b are only a small perturbation that particularly arises due to field displacement effects of the ring segments 32a and 32b that may be present during operation at $F_1$. For that reason, almost no quality and efficiency losses are ascertained at the first resonance frequency with respect to an identical linearly polarized birdcage resonator.

At the second resonance frequency $F_2$, a comparison can be made with a birdcage resonator operated in linear polarization at $F_2$. The efficiency and quality of the inventive resonator differs from such a resonator oscillating only at $F_2$ only by the usually somewhat longer current paths required on the ring segments 32a and 32b and field displacement effects caused by the presence of the additional ring elements. The difference is, in particular, almost insignificant on resonators whose diameter is smaller than their length.

In the general case, the second mode cannot only be at a frequency $F_2 < F_1$, as shown in FIG. 3b, but also at a frequency $F_2 > F_1$, that is, higher than the linear birdcage mode. In practice, it must be considered which variant is best chosen for the objectives to be achieved. In a low-pass birdcage resonator, it can be advantageous to choose $F_2<F_1$ because the non-dipolar modes of the birdcage resonator do not, in this case, fall into the same frequency band as the additional modes of the inventive resonator. This makes decoupling simpler in case of geometric and electric imperfections. In a high-pass birdcage resonator, the opposite situation can be advantageous.

Figure 4A:
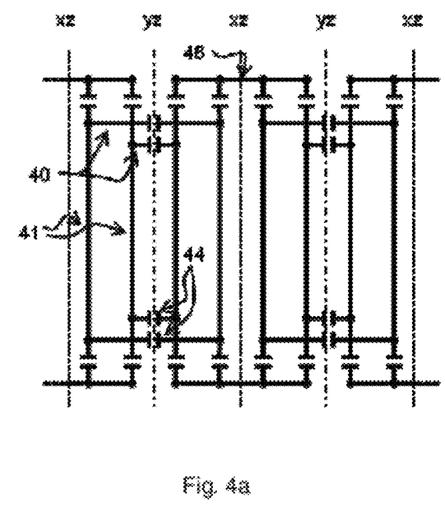
FIG. 4a shows a schematic developed diagram of an inventive doubly tuned resonator based on a low-pass birdcage resonator. Both modes are symmetrical with respect to the z-axis, which extends upward in the drawing.

FIG. 4a-f, FIG. 5a-d, and FIG. 6a-c show schematically different variants of the inventive doubly tuned resonator in an unwound view:

The embodiment shown in FIG. 4a is equivalent to FIG. 3a. It is characterized by the highest symmetry of both modes. However, the additional capacitors 44 of the additional mode at $F_2$ are placed on the yz-plane (=magnetic plane of symmetry of the birdcage mode of frequency F1) and not constituted doubly like the additional capacitors 31 in FIG. 3a. To generate the same modes, with otherwise identical parameters, the additional capacitors 31 in the embodiment shown in FIG. 3a have double the capacitance value as the additional capacitors 44 in FIG. 4a and are positioned with mirror symmetry with respect to the yz-plane. Galvanic connections between elements are marked as dots.

The embodiment shown in FIG. 4a has ring elements 33 divided into two and ring segments 40 that are interrupted by the additional capacitors 44 in the configuration from FIG. 4a. Each ring segment pair forms a current path 41 marked gray with two bars 11.

The dotted lines represent the electrical plane of symmetry of the birdcage mode at $F_1$, which coincides with the xz-plane. The dot-and-dash lines represent the magnetic plane of symmetry, which coincides with the yz-plane. The electrical plane of symmetry that coincides with the xy-plane is not shown in FIG. 4a.

For the resonance mode at $F_2$, the electrical plane of symmetry coincides with the yz-plane and the magnetic plane of symmetry coincides with the xz-plane and both are therefore orthogonal with respect to the symmetries of the birdcage mode at $F_1$. From the orthogonality of the electrical and magnetic planes of symmetry, ideally, perfect electromagnetic decoupling of the two modes from each other results, i.e., both modes can be excited completely separately from each other and their resonance frequency can be adjusted (tuned) completely separately from each other.

The orthogonality also means that there are at least two points 46 between which one mode exhibits a high potential difference during operation while the other mode exhibits no potential difference. Such points lie at the points of intersection of the structure with the magnetic plane of symmetry of one mode and with the electrical plane of symmetry of the other mode. These points can be used for selective coupling in and out of a resonance mode without the second mode being influenced by this connection.

Geometric and electrical symmetry of the resonator with reference to the xy-plane is desirable under certain conditions but is not necessary for the functionality of the resonator. The additional symmetry results in greater symmetry of the electrical and magnetic fields during operation and therefore usually improves the performance of the inventive resonator by increasing the sensitivity and reducing the losses in the measurement samples during operation. Except for the case of inductive couplings, the symmetry with respect to the xy-plane is usually violated by leads.

Figure 4B:
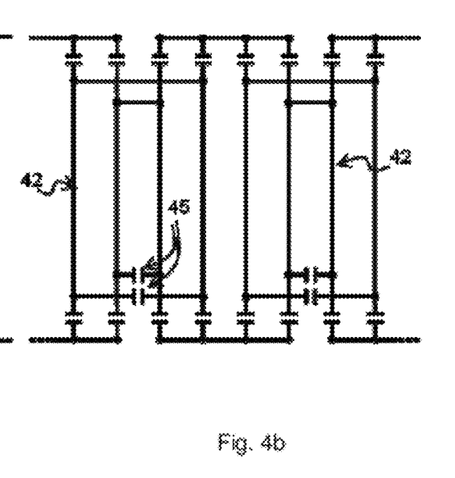
FIG. 4b shows a schematic unwound diagram of an inventive double tuned resonator with a DC current path for the second mode.

In FIG. 4b, electrical symmetry is broken with respect to the xy-plane at the second frequency $F_2$. While the current paths 41 in the embodiment shown in FIG. 4a are each capacitively interrupted at two points, the embodiment shown in FIG. 4b comprises current paths 42 that are capacitively interrupted only at one point by additional capacitors 45 and form DC current paths which are marked gray. In this variant, it is simpler to tune $F_2$ because the additional capacitors 45 must have lower capacitance values than the capacitors 44 from FIG. 4a. However, if it is not possible to produce capacitors with sufficient capacitance values that meet the requirements for installation in the RF resonator, the capacitors can very simply be installed a little way outside the RF resonator by means of extended leads in the embodiment shown in FIG. 4b because only a single capacitor is integrated into each current path.

Figure 4C:
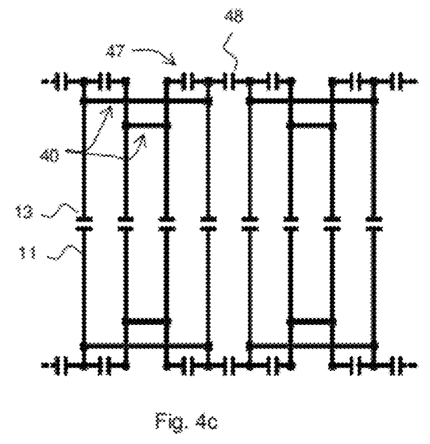
FIG. 4c shows a schematic unwound diagram of an inventive doubly tuned resonator based on a bandpass birdcage resonator. The two modes are symmetrical with respect to the z-axis.

FIG. 4c shows a bandpass variant of the inventive RF resonator with ring elements 47 divided into two, wherein the partial rings are capacitively interrupted by capacitors 48. In this variant, the ring segments are not capacitively interrupted and form a direct galvanic connection between the two bars 11. The current paths of the second resonance frequency are tuned to resonance in this case by means of the capacitors 13 on the bars 11.

Figure 4D:
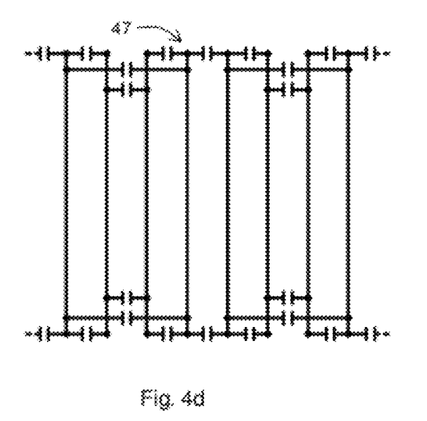
FIG. 4d shows a schematic unwound diagram of an inventive doubly tuned resonator based on a high-pass birdcage resonator. The two modes are symmetrical with respect to the z-axis.

FIG. 4d shows a high-pass variant of the inventive RF resonator and with capacitively interrupted ring elements 47 and can be combined with all previously described variations of the invention with respect to the current paths for the resonance at $F_2$.

Figure 4E:
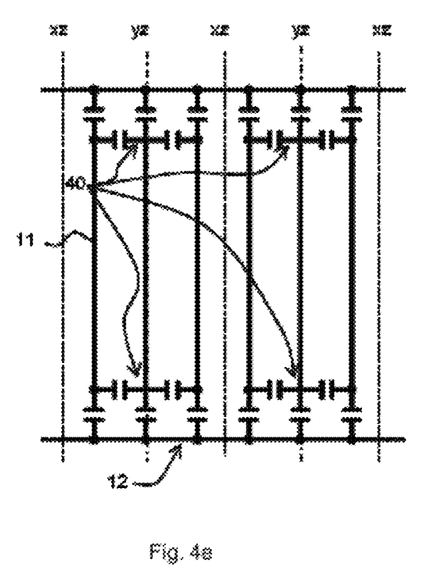
FIG. 4e shows a schematic unwound diagram of an inventive doubly tuned resonator based on a low-pass birdcage resonator with six bars. The resonance at $F_2$ is implemented in this case with four ring segments and four bars.

FIG. 4e shows an embodiment of the inventive RF resonator with six bars 11, single-part ring elements 12 and ring segments 40 that are capacitively interrupted at two points. To generate the second frequency, in this case only four of the six bars 11 are used.

Figure 4F:
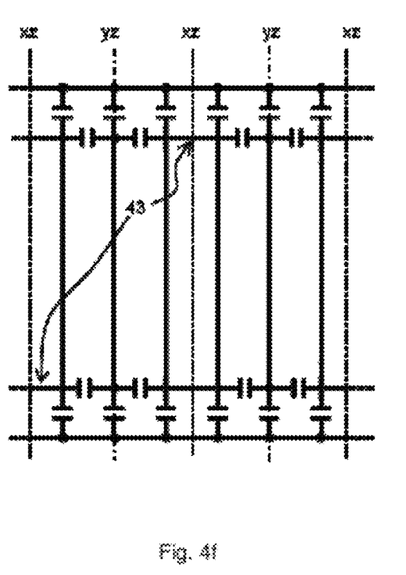
FIG. 4f shows a schematic unwound diagram of an inventive doubly tuned resonator based on a low-pass birdcage resonator with six bars. The resonance at $F_2$ is implemented in this case with two ring segments and two bars.

According to the invention, two to N additional ring segments can be inserted. To influence the symmetry of the birdcage mode of the inventive RF resonator as little as possible, it is advisable to use a resonator with N=4i+2 bars with use of only two additional ring segments and to electrically connect two mutually opposite bars to these ring segments. FIG. 4f shows such an embodiment with 6 bars and only two ring segments 43 with a central angle of 360° (closed rings). However, as they are defined for the purpose of this invention, these are not understood to be ring elements but ring segments because they only have galvanic connections with two bars, whereas ring segments have galvanic connections with all N bars (i.e. a ring element is either single-part and galvanically connected to all N bars, or two-part and in the form of partial rings, wherein each partial ring is connected to N/2 bars so that overall the two-part ring element is galvanically connected to all N bars). According to the invention, the embodiment of FIG. 4f could also be constituted with two ring segments with a central angle of 180°. However, in practice, this makes it more difficult to decouple the two dipolar modes of the inventive RF resonator because of the inductive couplings between the asymmetrical ring segments and the symmetrical ring elements.

Because of the greater homogeneity of the generated field and the greater efficiency at $F_2$, the embodiment of variant FIG. 4e using four bars 11 and four ring segments 32 is usually preferred to the variant from FIG. 4f, in which only two ring segments 43 and two bars 11 are used for the second resonance mode at $F_2$.

Figure 5A:
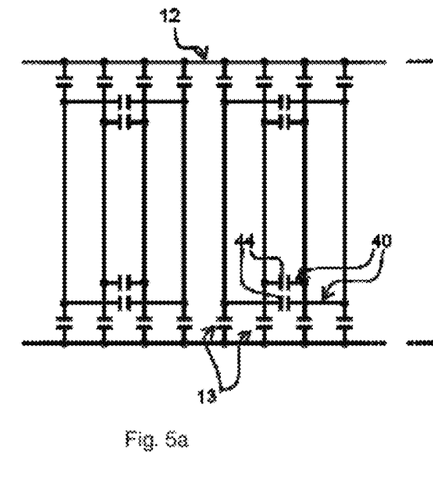
FIG. 5a shows a schematic unwound diagram of an inventive doubly tuned resonator based on a low-pass birdcage resonator. The ring elements of the first mode are not interrupted in this embodiment.
Figure 5B:
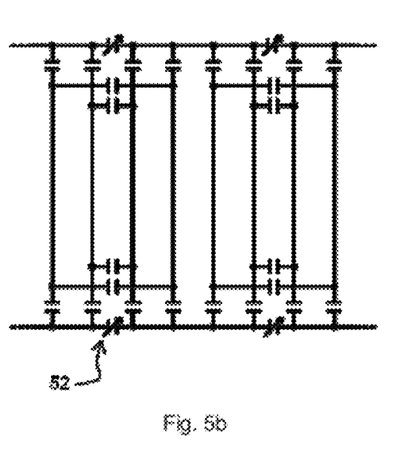
FIG. 5b shows a schematic unwound diagram of an inventive doubly tuned resonator based on a low-pass birdcage resonator. A tuning capacitor for the second resonance mode is a capacitive interruption of the ring elements of the first resonance mode.

Any rotational symmetry of the birdcage resonator that may exist does not therefore have to be broken by cutting open the ring elements. FIG. 5a shows an embodiment of the inventive doubly resonant RF resonator from FIG. 4a in a variant in which the ring elements 12 have not been interrupted. With closed ring elements 12, the capacitors 13 of the birdcage resonator are connected parallel to the additional capacitors 44 in the ring segments 40. Cutting open the ring elements into two partial rings, however, may simplify the structure by making setting of the resonance frequency and the field homogeneity at frequency $F_2$ independent of the capacitors. Furthermore, a tuning capacitor 52 with which the resonance frequency of the second mode can be changed at $F_2$ can be inserted into the ring (FIG. 5b) or can be connected with the ends of the partial ring by means of leads.

Figure 5C:
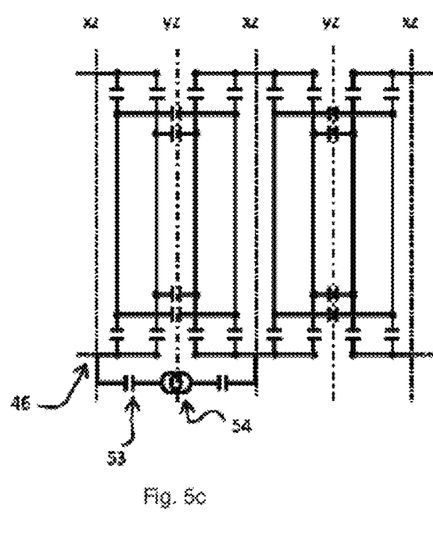
FIG. 5c shows a schematic unwound diagram of an inventive doubly tuned resonator based on a low-pass birdcage resonator. Control of the second mode is coupled at the points of symmetry of the first mode and implemented with two coupling capacitors to achieve symmetrical implementation.

The second frequency $F_2$ can be coupled in on the electrical plane of symmetry (xz-plane) of the resonance mode at the first frequency $F_1$ (zero potential points during operation at $F_1$). This is preferably constituted symmetrically and can be achieved capacitively as shown in FIG. 5c by means of a control 54 that provides coupling to the points of symmetry 46 of the first mode and is implemented with two coupling capacitors 53 for symmetrical implementation. To achieve symmetrical control, all connections known according to the prior art (such as coaxial or balun transformers) are used. As a principle, however, it would seem preferable to couple both frequencies inductively because this is the simplest way to implement a coupling in which the symmetry of the RF resonator is least influenced and the RF resonator does not have to be grounded at any point, that is, control of the RF resonator can be "floating."

Figure 5D:
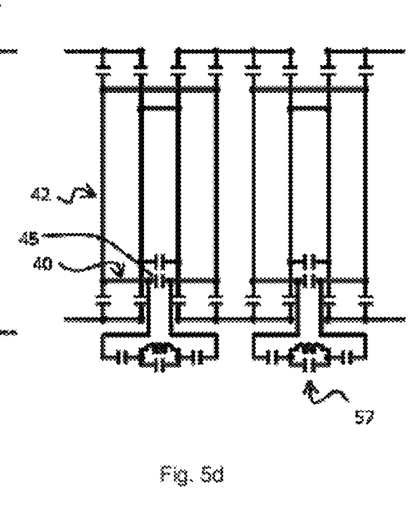
FIG. 5d shows a schematic unwound diagram of an inventive doubly tuned resonator based on a low-pass birdcage resonator with integrated DC current paths. An additional frequency is coupled via DC current paths of the second mode by means of a resonance circuit.

FIG. 5d shows an embodiment like in FIG. 4b but in which a third measurement frequency $F_3$ can be coupled to the DC current path 42 in the coil and can be used with all methods known according to the prior art for generating RF fields by means of saddle or solenoid coils. It is principally desirable to implement this coupling for all four DC current paths 42 because of the better homogeneity of the RF field generated.

This is not shown here for reasons of simplification. The DC current path behaves like a single-winding coil; for that reason, each variant for tuning one, two, or more resonance frequencies is used in conjunction with an inventive resonator in the prior art. One example of tuning to two resonance frequencies is configuration by means of a bandstop filter: A resonance circuit 57 connected parallel to the capacitor 45 of the ring segment is used in this circuit to block frequency $F_2$ of the resonator, enabling a third frequency to be connected where $F_3 < F_2$. Further embodiments contain not only the shunt configurations but also switches, multiple poles, coupled resonance circuits, etc. as explained, for example, in Section 6 of reference [1].

Different frequencies can also be coupled on different DC current paths. In this case, however, generally the higher frequencies in each case would all have to be blocked to avoid shielding the field by the resonance circle of the lower frequencies.

Further configurations for tuning more than two resonance frequencies contain the coupling with additional coils or resonators that, for example, can be arranged concentrically outside or inside the inventive resonator.

Figure 6A:
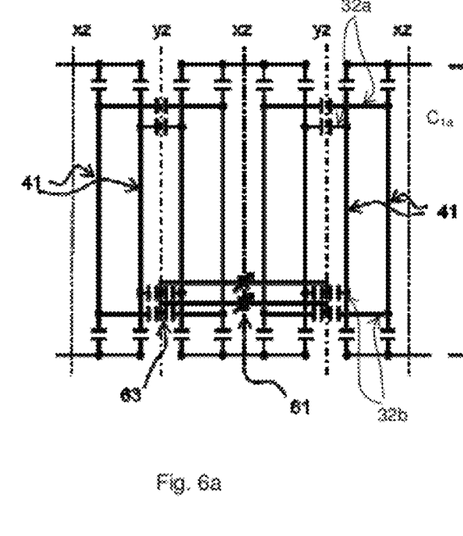
FIG. 6a shows a schematic unwound diagram of an inventive doubly tuned resonator based on a low-pass birdcage resonator with a tuning capacitor to vary the first resonance frequency, which is coupled at the points of symmetry of the second resonance mode.

Tuning the frequency $F_1$ can be achieved by one or more capacitors that are coupled on the electrical plane of symmetry (xz-plane) (zero potential points) of the frequency $F_2$, as shown in FIG. 6a. One tuning capacitor 61 each for mode $F_1$ is connected to points of symmetry 63 on one lower ring segment 32b each of the mode at $F_2$. To permit coupling at symmetry point 63, capacitors were constituted double and in series in the lower range of the RF resonator. Two current paths 41 each are connected to a tuning capacitor 61, which is ideally disposed on the xz-plane. Because the points connected by the tuning capacitor have no potential difference during operation at the second frequency $F_2$, the first frequency $F_1$ can be varied independently of the second frequency $F_2$. FIG. 6a shows tuning that does not influence the current distribution over the bars during tuning if the two tuning capacitors 61 are adjusted together using variable capacitances. For this, the capacitance ranges of the tuning capacitors 61 must be adapted to the geometric configuration and the capacitance values used in the resonator and may be different. To avoid influencing the symmetry in the z-direction, too, and to obtain a symmetrical potential distribution with respect to the xy-plane, two further capacitors of variable capacitance can be mounted on the upper ring segments 32a. However, because a variation of the resonance frequency is usually only used to compensate for the resonance shift when the object to be measured is introduced into the resonator and therefore corresponds to a small perturbation of the resonator, the effort for doubling the tuning capacitors can, in practice, only be justified if a further tuning range is desired. This could, for example, be adjustment of the resonance frequency of the birdcage mode from $^1$H to $^{19}$F.

Figure 6B:
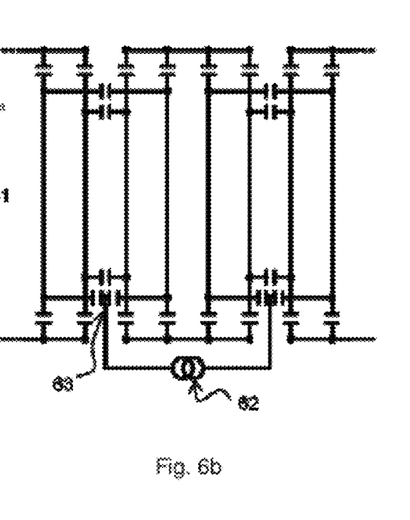
FIG. 6b shows a schematic unwound diagram of an inventive doubly tuned resonator based on a low-pass birdcage resonator. Control of the first mode is coupled to the points of symmetry on one of the ring segments of the second mode.

FIG. 6b shows that the same points of symmetry 63, at which tuning of the first frequency $F_1$ can be connected, can also be used for coupling, that is, for exciting and reading the signal at frequency $F_1$. For this purpose, a control 62 of the first mode is coupled to the points of symmetry 63 on one of the ring segments of the second mode. However, for this measurement frequency, too, inductive coupling seems to be most convenient because the symmetry of the coil is least influenced and it may be possible to dispense with ground connections or differential control elements.

Figure 6C:
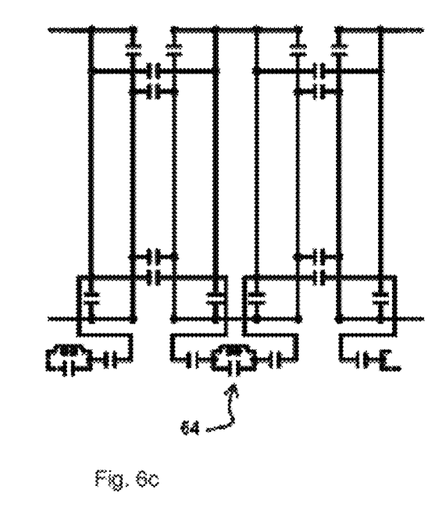
FIG. 6c shows a schematic unwound diagram of an inventive doubly tuned resonator based on a low-pass birdcage resonator with integrated DC current paths. An additional frequency is coupled via DC current paths of the first mode using a resonance circuit.

FIG. 6c shows a variant of the coil at which a third frequency $F_3$ was coupled in on a DC current path of the first frequency $F_1$ equivalent to the embodiment in FIG. 5d for the current paths of the second frequency. Here, too, resonance circuits 64 are used to block frequency $F_1$ and is disposed between two ring segments. Whereas in the example shown in FIGS. 5d and 6c for generating the first two frequencies $F_1$ and $F_2$, all eight bars are used, only 4 bars are used to generate $F_3$, that is, those that form a current path with the ring segments that are connected to the resonance circuits 64.

If the embodiment shown in FIG. 5d is combined with that shown in FIG. 6c, an RF resonator is obtained that can be tuned to four frequencies.

One major advantage of the inventive doubly tuned resonator is that the field homogeneities in φ, where φ is the azimuth angle in the xy-plane, that is, the current distributions over the bars, can be adjusted completely independently of each other for the two modes by adapting the capacitance of the corresponding capacitors and/or positions of the bars. The capacitance values of the capacitors of the birdcage resonator $C_{1a}$ to $C_{1p}$ in FIG. 7 can but do not have to be identical. In a symmetrical configuration, the capacitance values $C_{1a}$, $C_{1d}$, $C_{1e}$, $C_{1h}$, $C_{1i}$, $C_{1l}$, $C_{1m}$, and $C_{1p}$ are usually largely identical (symmetry with respect to the xy-, xz-, and yz-plane); the same applies to $C_{1b}$, $C_{1c}$, $C_{1f}$, $C_{1g}$, $C_{1j}$, $C_{1k}$, $C_{1n}$, and $C_{1o}$. If the tuning is coupled such that it is asymmetrical with respect to the xy-plane or coupled such as is shown in FIGS. 6a and 6b, the capacitance values $C_{1a}$, $C_{1d}$, $C_{1e}$, and $C_{1h}$ will slightly differ from $C_{1i}$, $C_{1l}$, $C_{1m}$, and $C_{1p}$ in order to be able to maintain the electrical symmetry during operation. In the general case, however, all capacitors can also have different capacitances, for example, if the symmetry of the resonator is no longer maintained because of connection legs or couplings with further asymmetrical resonators or a manufacturing-induced deviation of the symmetry is to be corrected. The aim is always to ensure symmetry of the electrical field with respect to the xy-, xz-, and yz-plane.

Figure 7:
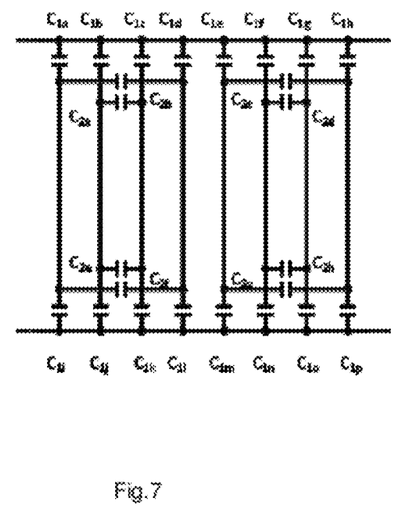
FIG. 7 shows a schematic unwound diagram of an inventive doubly tuned resonator based on a low-pass birdcage resonator. The different capacitors have different capacitance values $C_{1a}$-$C_{1p}$ or $C_{2a}$-$C_{2h}$ to compensate for structural asymmetries and, at the same time, to retain the orthogonality of the two dipolar resonance modes with respect to each other and to optimize the field homogeneities at both frequencies.

For the second dipolar mode, the capacitance values $C_{2a}$, $C_{2d}$, $C_{2e}$, and $C_{2h}$ are usually different from $C_{2b}$, $C_{2c}$, $C_{2e}$, and $C_{2f}$ since the ring segments that connect the relevant bars via these capacitors have different inductances because of their different lengths. This means that the currents are distributed approximately sinusoidally over the resonator, which can simply be achieved by increasing the capacitance values $C_{2a}$, $C_{2d}$, $C_{2e}$, and $C_{2h}$. The capacitances of the additional capacitors are therefore chosen such that the currents are approximately sinusoidally distributed over the resonator.

By varying the bar positions, the efficiency and/or homogeneity of the one mode can be optimized to the detriment of the other mode. By varying the bar positions, as explained above, the field homogeneities can be adapted as much as possible by correcting the capacitance values $C_{1a}$ to $C_{1p}$ and $C_{2a}$ to $C_{2h}$.

One especially big advantage of the inventive multiply tuned RF resonator is that, by varying the capacitance values and/or positions of the bars, the field homogeneities of the two modes are independently optimized in $\phi$ and can largely be set identically, which, for example, increases the efficiency of magnetization transfer in polarization transfer experiments. Whereas the positions of the bars affect the field homogeneities of the two resonance modes (and possibly according to FIG. 5d or FIG. 6c also coupled-in resonances), the variation of the capacitance values $C_{1a}$ to $C_{1p}$ and $C_{2a}$ to $C_{2h}$ only influence one mode. One exception are configurations in which the ring elements are not interrupted, for example, in FIGS. 4e, f and 5a, b, in which the capacitors 13 of the birdcage resonator are connected in parallel with the additional capacitors 44 and ring segments 40 and configurations as FIG. 4c, in which the capacitors are located on the bars for tuning the second frequency and are therefore also located in the current path of the first frequency.

Figure 9:
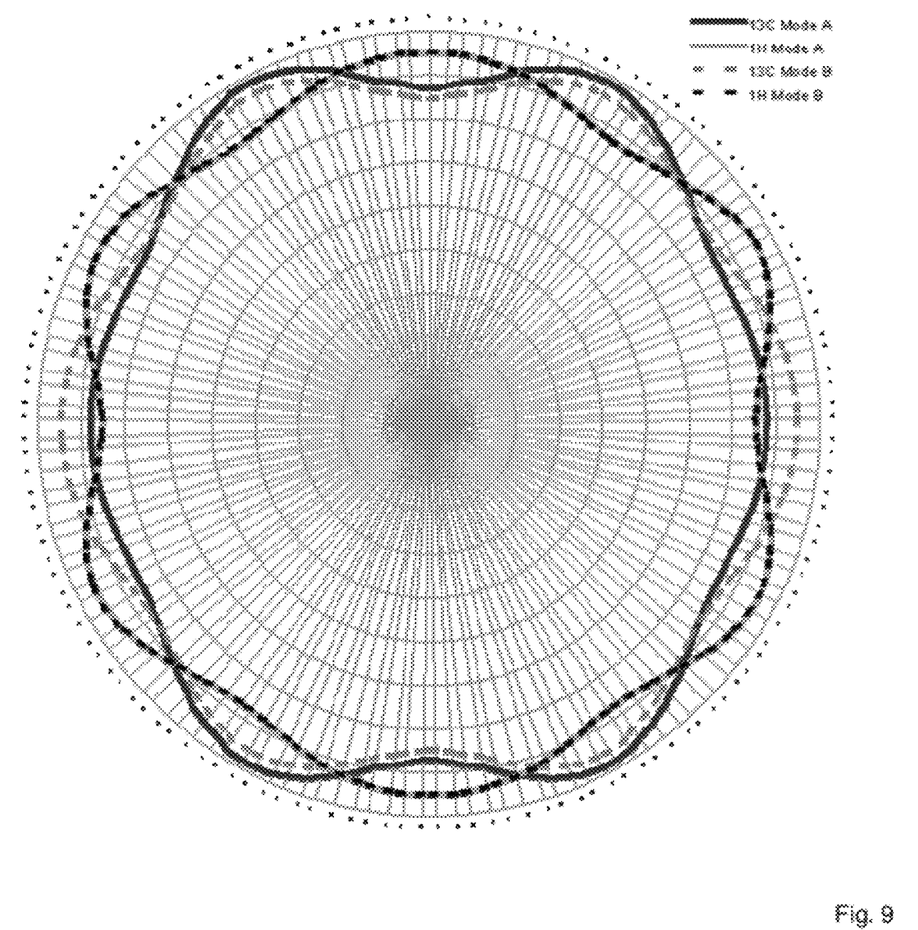
FIG. 9 shows the amplitude of the magnetic fields on a radius of 2.2 mm in the xy-plane for the two NMR modes of an inventive resonator tuned to $^1$H and $^{13}$C frequency. The field amplitudes are shown for two configurations A and B and both resonance frequencies, wherein the configurations A and B differ in the choice of the capacitance values of the capacitors $C_{2a}$ to $C_{2f}$ of a resonator according to FIG. 7.

FIG. 9 shows an example of the distribution of the magnetic field on a radius of 2.2 mm in the xy-plane for the amplitude of the magnetic fields of the two dipolar modes for two configurations of an inventive resonator tuned to $^1$H and $^{13}$C frequency with eight rotationally symmetrically positioned bars. The difference between the configurations A and B lies in the variation of the capacitance values of the capacitors $C_{2a}$ to $C_{2f}$ by means of which the field homogeneity could be improved at the $^{13}$C frequency. No influence on the field distribution of the $^1$H mode can be ascertained here.

Figure 8A:
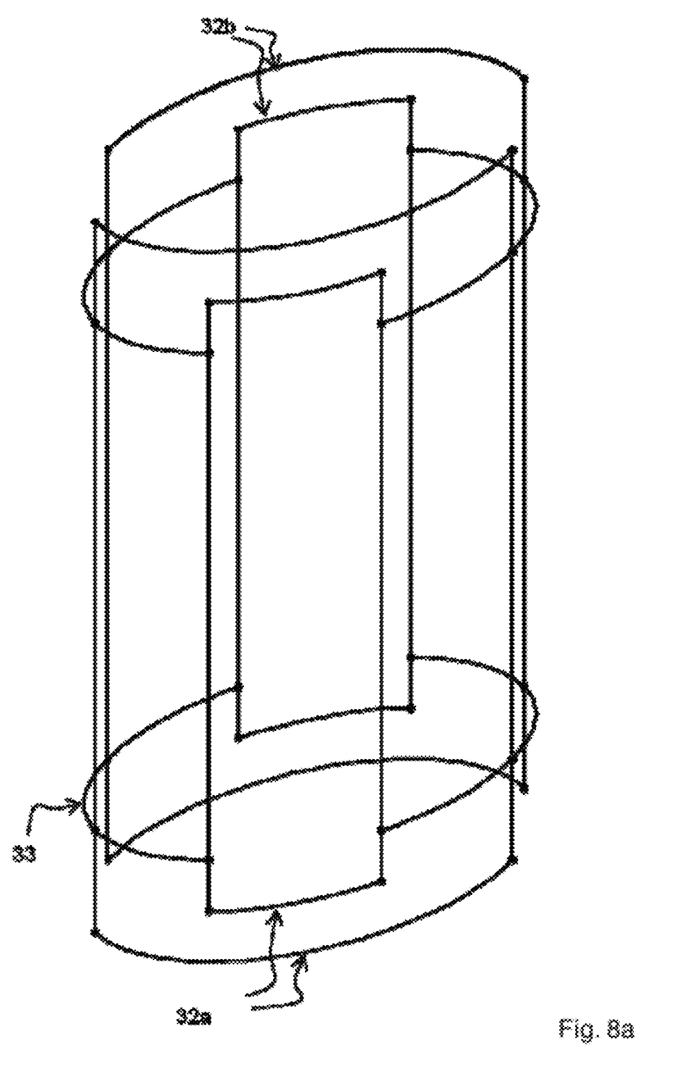
FIG. 8a shows a schematic perspective view of the current paths of an inventive resonator according to FIG. 4a, in which the ring segments of the second resonance mode are constituted axially on the same radial position as the ring elements of the first resonance mode. Capacitors are not shown in the drawing.

The inventive HF resonator can be constituted in such a way that, in addition to the field homogeneity in $\phi$, the field profile in the z-direction is largely coincident for both modes. The positioning of the ring segments 32a, 32b of the second mode at F2 permits a certain allowance for adaptation of the profiles. These can, on one hand, be placed on the same diameter as the ring elements 33 of the first mode at $F_1$, which however means that at least part of the ring segments 32a, 32b must be shifted in the z-direction with respect to the ring elements 33, as is schematically shown in FIG. 8a.

Figure 8B:
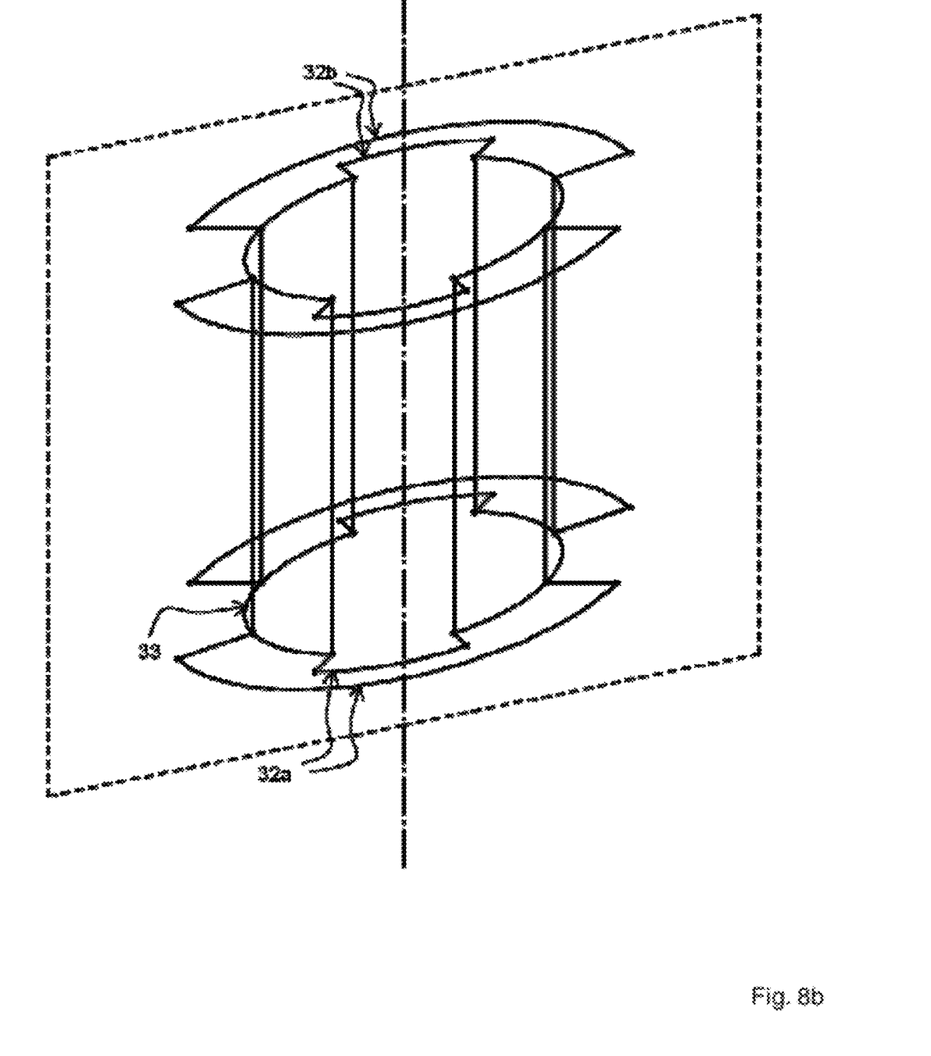
FIG. 8b shows a schematic perspective view of the current paths of an inventive resonator according to FIG. 4a, in which the ring segments of the second resonance mode are constituted radially on the same axial position as the ring elements of the first resonance mode. Capacitors are not shown in the drawing.

Alternatively, the ring segments 32a, 32b can be positioned in the same position z but at different diameters (FIG. 8b). It is also possible to combine the two variants. In particular, in the case of a broken-open ring element 33 of the birdcage resonator, it is convenient to use the gap created by one of the ring segments of the second resonance mode.

In the inventive RF resonator, a second measurement frequency $F_2$ is added to a birdcage resonator with N bars by installing at least two additional ring segments. Further frequencies can be coupled on both resonance paths. The inventive doubly or multiply tuned RF resonator solves the problem of insufficient radial field homogeneity and poor efficiency that, for example, known resonators with sub-grids exhibit. Its structure is simple and avoids the necessity of this type of resonator of operating both frequencies $F_1$ and $F_2$ in quadrature or considerably increasing the number of bars (doubling it), which would greatly lower the efficiency at least at $F_1$. Quadrature operation is a major problem, especially for the multiple resonance sample heads that are commonly used in NMR (3 to 5 measurement frequencies) because additional frequencies have to be coupled, which usually cancels the degeneration of the birdcage modes and this can only be corrected with great effort and usually with a loss at all measurement frequencies.

As opposed to a birdcage geometry with filters and double the number of end rings from the prior art, the design of the inventive resonator is extremely simple. It is possible to tune both frequencies completely independently. It is not necessary to tune a large number of bandstop filters and problems with asymmetry of the bandstop filters when tuning and coupling the birdcage resonator with multiple end rings do not occur. No additional losses due to the bandstop filters occur that would lower the efficiency of the resonator in both modes. Compared with the multiply tuned RF resonators known from the prior art, the inventive resonator is therefore simpler to manufacture and has better functionality.

LIST OF REFERENCE SYMBOLS $F_1$ Frequency of the birdcage mode (first frequency)
$F_2$ Frequency of the additional mode of the current paths (second frequency)
$F_3$ Frequency of a further resonance of the current paths (third frequency)
$C_1$-$C_8$ Capacitances of the capacitors 13
11 Bars (inductive)
12 Single-part ring elements (inductive)
13 Capacitors that interrupt the bars of the birdcage resonator capacitively
14 Degenerate mode with frequency $F_1$
30 Interruptions of the ring elements
31 Additional capacitors (=capacitors in the current paths to generate the second frequency)
32a Upper ring segments
32b Lower ring segments
33 Ring elements divided into two
40 Ring segments
41 Multiply capacitively interrupted current path for generating the second frequency (with a hatched background)
42 Singly capacitively interrupted DC current path for generating the second frequency (with a hatched background)
43 Ring segments with central angle 360°
44, 45 Additional capacitors (=capacitors in the current paths to generate the second frequency)
46 Points of symmetry of the first mode (=point of intersection of a ring element with the xz-plane)
47 Ring elements interrupted capacitively and divided into two
48 Capacitors that interrupt the ring elements of the birdcage resonator capacitively
52 Tuning capacitor second frequency
53 Coupling capacitor (matching capacitor) for capacitive coupling of the control of the second frequency
54 Control of the second frequency
57 Resonance circuit for blocking the second frequency $F_2$
61 Tuning capacitor for first frequency $F_1$
62 Control for first frequency $F_1$
63 Symmetry point of the second mode (=point of intersection of a ring segment with the yz-plane)
64 Network for coupling additional frequencies (resonance circuit)

REFERENCES

[1] Mihaela Lupu, Andre Briguet, Joel Mispelter, NMR Probeheads: For Biophysical and Biomedical Experiments, Imperial College; 1 edition (May 5, 2006), ISBN: 1860946372

[2] U.S. Pat. No. 4,680,548
[3] U.S. Pat. No. 4,916,418
[4] U.S. Pat. No. 6,100,694

I claim:

1. An RF resonator for an NMR apparatus, the RF resonator defined by a Cartesian coordinate system having a Z-axis, an xz-plane and a yz-plane, the resonator comprising:
a birdcage resonator for transmitting and/or receiving signals at a first measurement frequency, said birdcage resonator having at least two electrically conducting ring elements that are disposed coaxially about the Z-axis and spaced from each other as well as N electrically conducting bars that are disposed parallel to the Z-axis, wherein N>4 and even, each ring element being electrically connected with all N bars; and
at least one pair of electrically conducting ring segments for transmitting and receiving signals with a second measurement frequency, ring segments of a pair being spaced from each other with respect to the Z-axis, each ring segment being galvanically or capacitively connected to only two bars of the RF resonator, wherein said pair of electrically conducting ring segments forms an additional electrical connection between said only two bars, thereby defining a current path with said only two bars, said current path being capacitively interrupted at least one point, wherein the RF resonator is symmetrical with respect to the xz-plane and with respect to the yz-plane and said ring segments and said bars electrically connected to said ring segments are symmetric with respect to the yz-plane.

2. The RF resonator of claim 1, wherein said ring element is interrupted and comprises two partial rings that are not capacitively connected to each other, each partial ring being electrically connected to N/2 bars.

3. The RF resonator of claim 1, wherein at least one of said ring segments has at least one capacitive interruption, which is disposed symmetrically with respect to the yz-plane.

4. The RF resonator of claim 1, wherein at least some of said ring segments are disposed at a same axial position with respect to the Z-axis as said ring elements.

5. The RF resonator of claim 1, wherein at least some of said ring segments are disposed at a same radial distance from the Z-axis as said ring elements.

6. The RF resonator of claim 1, wherein a number of ring segments is equal to said number N of bars.

7. The RF resonator of claim 1, wherein at least one ring element is capacitively interrupted by a tuning capacitor that is disposed in the yz-plane.

8. The RF resonator of claim 1, wherein a ring segment of said current path of said second measurement frequency is not capacitively interrupted.

* * * * *